(12) United States Patent
Martin et al.

(10) Patent No.: US 6,933,738 B2
(45) Date of Patent: Aug. 23, 2005

(54) FIDUCIAL ALIGNMENT MARKS ON MICROELECTRONIC SPRING CONTACTS

(75) Inventors: Robert C. Martin, San Francisco, CA (US); Eric T. Watje, Santa Clara, CA (US)

(73) Assignee: FormFactor, Inc., Livermore, CA (US)

( * ) Notice: Subject to any disclaimer, the term of this patent is extended or adjusted under 35 U.S.C. 154(b) by 336 days.

(21) Appl. No.: 09/906,999

(22) Filed: Jul. 16, 2001

(65) Prior Publication Data

US 2003/0013340 A1 Jan. 16, 2003

(51) Int. Cl.$^7$ ............................................. G01R 31/02
(52) U.S. Cl. ...................................... 324/758; 324/755
(58) Field of Search ................................. 324/754, 755, 324/757, 758, 765, 158.1, 762

(56) References Cited

U.S. PATENT DOCUMENTS

| | | | | |
|---|---|---|---|---|
| 5,686,318 A | * | 11/1997 | Farnworth et al. | ............. 438/15 |
| 6,239,590 B1 | * | 5/2001 | Krivy et al. | ............. 324/158.1 |
| 6,285,203 B1 | * | 9/2001 | Akram et al. | ................ 324/755 |

FOREIGN PATENT DOCUMENTS

| | | |
|---|---|---|
| JP | 61154044 | 7/1986 |
| JP | 02065150 | 3/1990 |
| JP | 06209033 | 7/1994 |
| JP | 10160793 | 6/1998 |

* cited by examiner

Primary Examiner—Vinh Nguyen
Assistant Examiner—Russell M. Kobert
(74) Attorney, Agent, or Firm—O'Melveny & Myers; N. Kenneth Burraston

(57) ABSTRACT

Microelectronic spring contacts with fiducial alignment marks for use on a semiconductor wafer contactor or similar apparatus, and methods for making such marks, are disclosed. Each alignment mark is placed on a pad adjacent to a contact tip. The alignment mark is positioned on the pad so that it will not contact the terminal or any other part of a wafer under test. The alignment mark and the contact tip are preferably positioned on the pad in the same lithographic step. Then, the pad and like pads, selected ones of which also have similar alignment marks, are attached to the ends of an array of resilient contact elements. A plurality of alignment marks in accurate registration with a plurality of contact tips on a contactor is thus disclosed. Configurations for ensuring that the alignment marks remain free of debris and easily located for essentially the entire life of the contactor are disclosed, as are various different exemplary shapes of alignment marks.

12 Claims, 7 Drawing Sheets

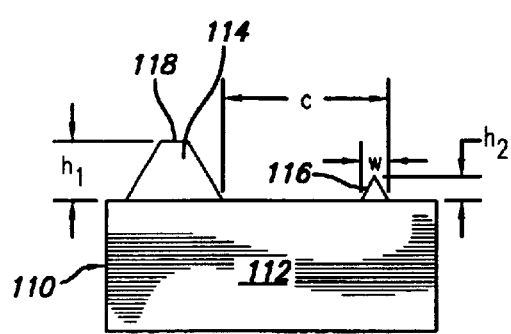
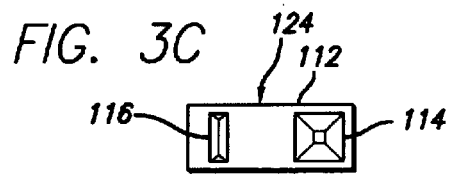
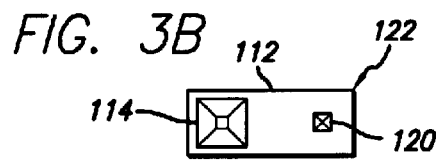
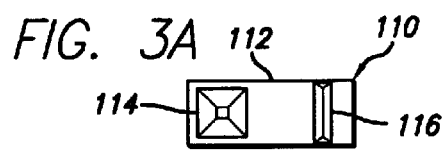
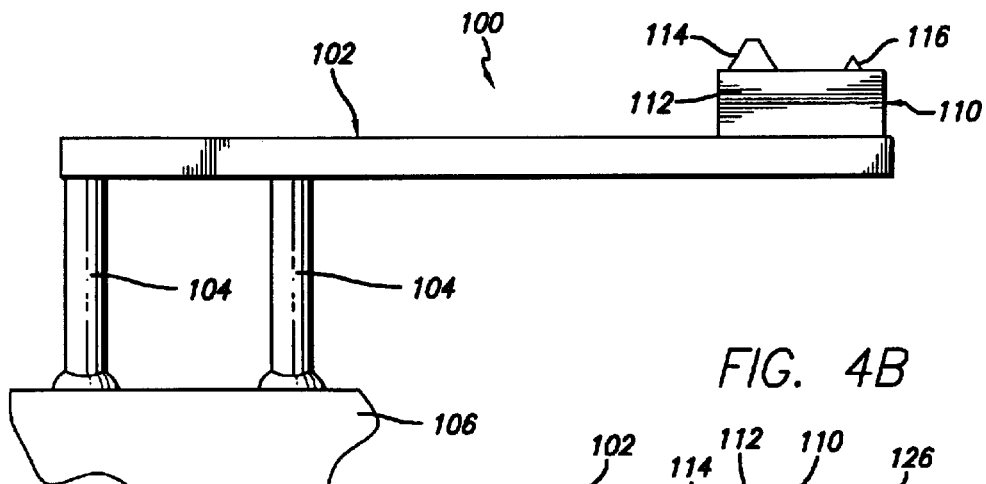
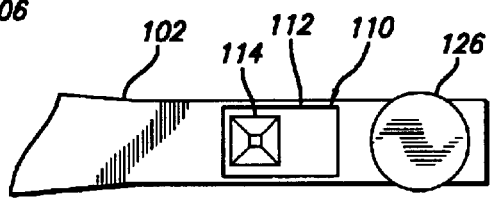
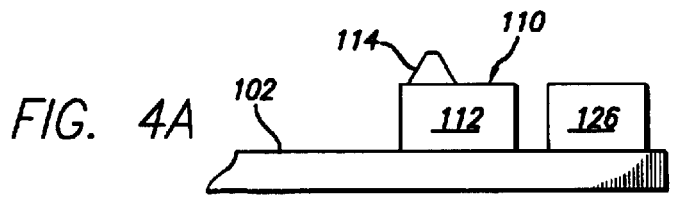

FIDUCIAL ALIGNMENT MARKS ON MICROELECTRONIC SPRING CONTACTS

BACKGROUND OF THE INVENTION

1. Field of the Invention

The present invention relates to components for testing of semiconductor devices, and more particularly to fiducial alignment marks on microelectronic contacts for use on probe cards, contactors, and similar components.

2. Description of Related Art

Testing of semiconductor devices, particularly wafer-level testing done prior to singulation of semiconductor devices from a wafer, is frequently performed using a component, such as a contactor assembly having a plurality of microelectronic contacts, each of which contacts a terminal pad, solder ball, or other such terminal on the wafer. Because of the very fine pitch at which the terminals on the wafer are disposed, and the correspondingly small scale of the microelectronic contact structures, alignment of contacts and the terminals on the wafer is accomplished with the help of special alignment machines and methods.

According to one prior art alignment method, at least three alignment marks (sometimes called "fiducial" alignment marks) are placed on the wafer at an earlier device manufacturing stage. The position of these marks is known with a high degree of accuracy relative to the terminals or contact pads on the wafer. On the contactor, comparably accurate alignment marks are not present. This has limited the accuracy with which certain types of contactors, such as those with tungsten wire contact elements, can be placed. Tungsten wire contacts cannot be placed on the contactor with a high degree of accuracy, and hence cannot be maintained in registration with marks on the contactor. However, certain other types of contactors, such as contactors with composite contacts having lithographically placed contact tip structures as disclosed, for example, in U.S. Pat. No. 5,864,946 (Eldridge et al.), may be provided with a plurality of very accurately positioned spring contact tips.

Generally, to be useful as an alignment mark, a mark must be positioned with an accuracy that is at least one-half the finest pitch (spacing) between adjacent terminals on the wafer. That is, the position of the alignment mark must be known with certainty to be within a sphere having a diameter no greater than one-half of the pitch of the terminals on the semiconductor device. For memory devices, many of which have a pitch of about 80 micrometers (3.2 mil), an accuracy of at least about 40 micrometers (1.6 mil) is accordingly required. Because they are formed during the same lithographic steps used to create electronic features on the wafer, wafer alignment marks can be disposed on the wafer with the required accuracy. Lithographically placed contact tips on some types of contactors are also capable of being disposed on the contactor with comparable accuracy.

According to the prior art alignment method, three or more of these lithographically placed contact tips are selected to serve the function of alignment marks during a subsequent positioning step. Typically, a relatively small flat area on the distal end of the contact tips is used as a visual target. These flat areas are relatively easy to see and distinguish using commonly used vision systems. Using the alignment marks on the wafer and the selected contact tips on the contactor as reference points, the wafer and contactor are then positioned relative to one another so that each of the contact tips on the contactor can make contact with a corresponding terminal on the wafer. Using this method, it is possible to make contact with an array of terminals disposed at a very fine pitch.

Although the foregoing alignment method represents advancement over older methods in that it permits alignment with terminals disposed at pitches down to about 40 micrometers, it suffers from certain limitations. One limitation is related to the use of spring contact tips for alignment of the contactor. During repeated applications of the contactor, such contact tips can become contaminated with debris (such as metal oxides or organic residue) from terminals on the wafers under test. Such debris normally does not interfere with the electrical operation of the contactor, but can make it difficult to locate the selected contact tips with the requisite degree of accuracy. The target areas on the contact tips may become obscured or difficult to see. As even finer pitches for terminals on semiconductors are tested, and the size of contact tips shrinks accordingly, this limitation of the prior art method becomes increasingly apparent and costly to overcome. It is desired, therefore, to provide an apparatus and method that overcomes the limitations of the prior art method and yet is compatible with the installed base of vision and positioning systems.

SUMMARY OF THE INVENTION

The present invention provides an apparatus and method for providing fiducial alignment marks on a contactor, that overcomes the limitations of prior art methods. According to an embodiment of the invention, an alignment mark is placed on a region or pad adjacent to the contact tip. The alignment mark is positioned on the pad so that it does not contact the terminal or any other part of the wafer under test, preferably so that it remains free of debris from the contact tip after repeated use of the contactor. The alignment mark and the contact tip are preferably positioned on the pad in the same lithographic step. Then, the pad and like pads, selected ones of which also have similar alignment marks, are attached with the assembled alignment marks and contact tips to the ends of an array of resilient contact elements. A plurality of alignment marks in accurate registration with a plurality of contact tips on a contactor may thus be provided. The alignment marks may readily be located to within an accuracy of at least about 3–5 $\mu$m (about 0.1 to 0.2 mil), and so may be used in connection with wafers having terminals disposed at a pitch as fine as about 20–30 $\mu$m (about 0.8 to 1.2 mil). Higher accuracies, such as positioning the alignment marks with an accuracy of about 1.5 micrometers (0.06 mil), are also believed to be attainable. Furthermore, the alignment marks, including any targets thereon, may be positioned so as to remain free of debris and, therefore, easily located for essentially the entire life of the contactor. The alignment marks may be provided in various different shapes, exemplary ones of which are disclosed herein.

A more complete understanding of the fiducial alignment marks will be afforded to those skilled in the art, as well as a realization of additional advantages and objects thereof, by a consideration of the following detailed description of the preferred embodiment. Reference will be made to the appended sheets of drawings which will first be described briefly.

BRIEF DESCRIPTION OF THE DRAWINGS

FIG. 2A is a side elevation view of the spring contact shown in FIG. 1.

FIG. 2B is a side elevation view of the tip structure for the spring contact shown in FIG. 1.

FIGS. 3A–3C are plan views of exemplary alternative tip structures having co-located contact tips and alignment marks for use with a spring contact.

FIGS. 4A–4B are side elevation and plan views, respectively, of a tip portion of a spring contact, showing a circular-pad type of alignment mark and an adjacent contact tip.

DETAILED DESCRIPTION OF THE PREFERRED EMBODIMENT

The present invention provides a method and apparatus for providing precise fiducial alignment marks on microelectronic contacts and on contactors carrying a plurality of microelectronic contacts. In the detailed description that follows, like element numerals are used to describe like elements shown in one or more of the figures.

Figure 1:
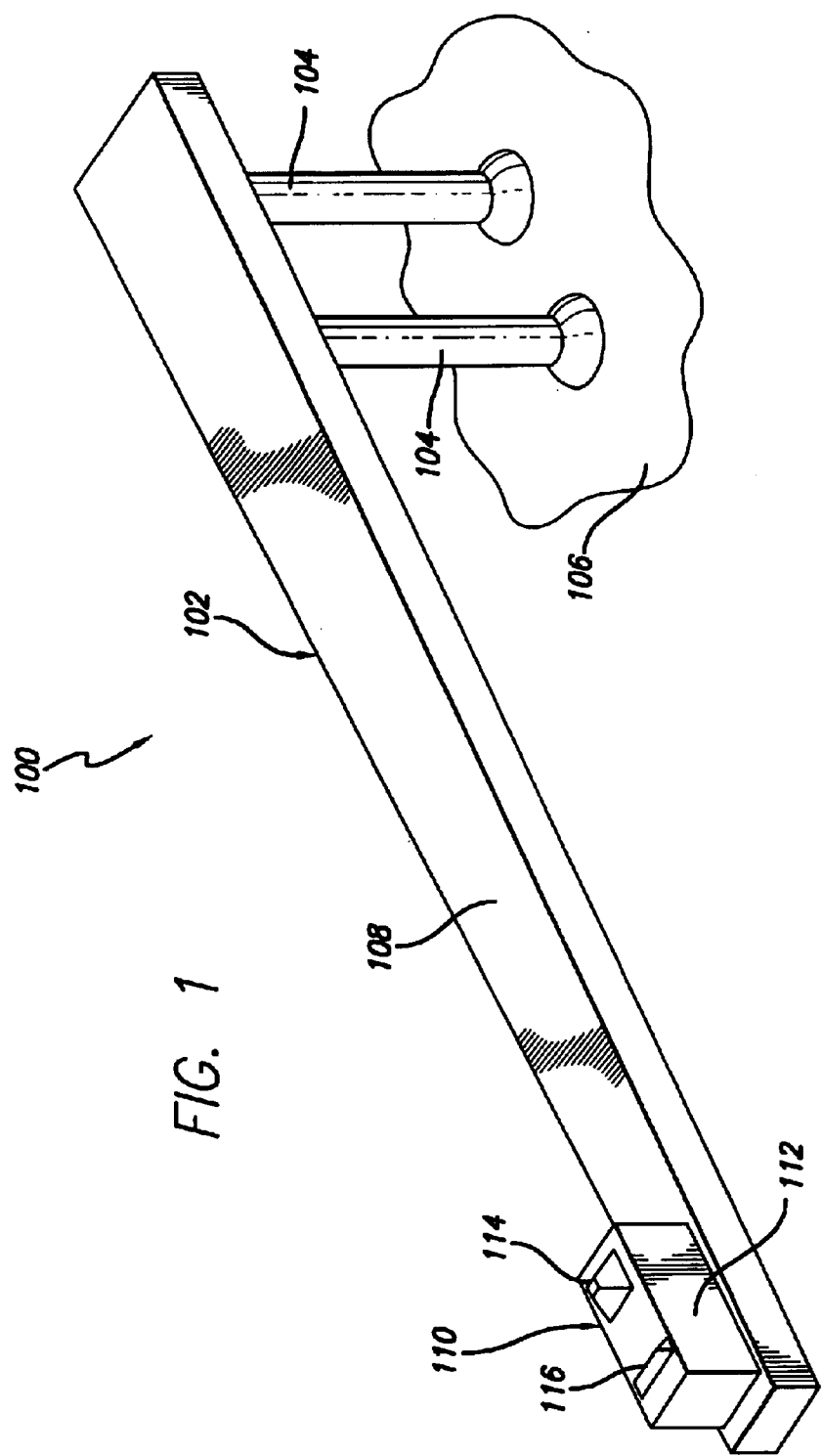
FIG. 1 is a perspective view at very high magnification of a cantilever-type microelectronic spring contact having a tip structure according to the invention with a co-located contact tip and alignment mark.

Referring to FIG. 1, in an embodiment of the invention, an alignment mark 116 is provided on microelectronic spring structure 100. Spring structure 100 may be configured in various ways as known in the art. In the embodiment shown in FIG. 1, spring structure 100 is configured as disclosed in the commonly-owned, co-pending application Ser. No. 09/746716, filed Dec. 22, 2000, which is incorporated herein by reference, in its entirety. That is, microelectronic spring structure 100 comprises a group of column elements or posts 104, a cantilevered beam 102 secured transverse to the group of column elements, and a contact tip 114 on a portion of the cantilevered beam distal from the column elements. In an alternative embodiment, a lithographically deposited post component is used instead of the column elements 104, as disclosed, for example, in the commonly-owned, co-pending application Ser. No. 09/023,859, filed Feb. 13, 1998. Additional examples of suitable microelectronic spring contacts for use with the present invention, and methods for making such contacts, are provided, e.g., by commonly-owned, co-pending applications Ser. No. 09/023,859, filed Feb. 13, 1998, Ser. No. 09/364,788, filed Jul. 30, 1999, and Ser. No. 09/710,539, filed Nov. 9, 2000, all of which applications are incorporated herein, in their entirety, by reference.

Each of the foregoing applications discloses methods, and the resulting spring structures, for making a microelectronic spring structure by depositing (such as by electroplating) a resilient material on or in a sacrificial layer over a substrate, and then removing the sacrificial layer. The sacrificial layer may be shaped to have a sloped or contoured region extending above and away from the substrate, such as by impressing a moldable (plastic) layer using a specially shaped forming tool to form a mold. In the alternative, or in addition, the sacrificial layer is patterned to provide openings revealing the substrate below it. A seed layer is deposited over the sacrificial layer and/or exposed region of the substrate, and patterned in the plan shape of the desired spring structure or component. The resilient layer is then plated onto the seed layer. The sacrificial layer is removed, leaving beam, tip and/or post components that are subsequently assembled to provide structures like structure 100. In some embodiments, no assembly is required because the deposition/patterning steps provide a spring structure having a base portion attached to the substrate and a contoured and/or sloped beam extending therefrom. However, each of the foregoing structures may include a contact tip that is precisely formed using a pattern-masking/etching process and assembled to the spring contact structure. Accordingly, the invention may be readily adapted for use with each of the foregoing structures and methods, and to any other structure that provides a similar opportunity for precise formation of a contact tip to a microelectronic contact structure.

As shown in FIG. 1, microelectronic contact structure 100 comprises a beam 102 having an upper surface 108 that serves as a datum surface for attachment of a tip structure 110. To achieve precise planarity of surface 108, beam 102 is preferably formed by a lithographic process, for example, by deposition of a resilient material on a sacrificial layer or substrate as described, e.g., in Ser. No. 09/023,859 referenced above. As used herein, "sacrificial layer" refers to a material, such as a photoresist, that is deposited on a substrate during formation of a desired component or structure, such as a microelectronic spring contact component, and later removed from the substrate. "Sacrificial substrate" refers to a substrate that is attached to a desired component or structure, such as a microelectronic spring component, during its formation, and later removed from the component or structure. So long as structure 100 provides a datum surface 108 for attachment of a contact tip 114 and/or a tip structure 110, the remaining details of structure 100 may be configured in various different ways. For the purpose of illustrating an exemplary application of the present invention, other details of structure 100 are described below, but it should be appreciated that the invention is not limited thereby.

The beam 102 of structure 100 is secured to substrate 106 by column elements 104. Substrate 106 comprises a contactor for a semiconductor device, such as a semiconductor wafer. Such contactors often comprise specially shaped slabs of ceramic materials having terminals on opposing major surfaces and internal electrical traces connecting each terminal on a first surface with a corresponding terminal on a second surface. In the alternative, substrate 106 may comprise some other electronic component, such as, for example, a probe card, or other printed circuit board; a semiconductor device, such as a silicon chip or wafer; a ceramic material, or an electrical connector. Column elements 104 are typically attached to a terminal (not shown) of substrate 106, which is in turn connected to a circuit element of an electronic component, such as, for example, an interconnect or interposer substrate, a semiconductor wafer or die, a production or test interconnect socket; a ceramic or plastic semiconductor package, or chip carrier.

Contact tip 114 is attached to surface 108 of beam 102. In an embodiment of the invention, contact tip 114 is attached to pad (stand-off) 112, which is in turn mounted to surface 108. Together, contact tip 114 and pad 112 comprise tip structure 110. Tip structure 110 further comprises an alignment mark 116. Pad 112 is used to elevate contact tip 114 above the upper surface 108 of beam 102, so that the contact tip contacts a face of a mating electronic component before any other part of structure 100. In an alternative embodiment, such as when beam 102 is sloped away from column elements 104 and substrate 106, pad 112 may be omitted, and contact tip 114 and alignment mark 116 may be attached directly to surface 108. In both cases, the contact tip 114 and alignment mark 116 may be formed on a sacrificial substrate and attached together to beam 102, thereby providing precise positioning of the alignment mark with respect to the contact tip as necessary to provide alignment that is at least about as accurate as aligning to the contact tip itself.

A side view of structure 100 is shown in FIG. 2A. Contact tip 114 is preferably located on pad 112 towards columns 104 (i.e., towards the secured base of beam 102), relative to alignment mark 116, which is located towards the free end of beam 102. This relative positioning helps to avoid accumulation of debris on the alignment mark, because debris tends to be pushed towards the fixed end (base) of beam 102 when tip 114 is pressed against a mating terminal. Also, positioning the alignment mark towards the free end of the beam helps to avoid inadvertent contact between the alignment mark and a mating substrate, because the free end of the beam tends to be depressed further away from the mating substrate than portions closer to its fixed base. Contact with the mating substrate may damage the mark or cause it to be occluded with debris, and thus is usually not desirable. However, for some applications, there may not be sufficient available space to allow for locating the alignment mark towards the free (distal) end of beam 102. In other cases, the beam may be configured differently so that a location closer to the distal end is disadvantageous for other reasons. For such applications, the alignment mark 116 may be positioned closer to the fixed base of beam 102, such as shown in plan view in FIG. 3C.

FIG. 2B shows an enlarged side view of the tip structure 110, showing exemplary relative sizes and positions of a contact tip 114 and alignment mark 116 on a pad 112. Contact tip 114 may be a truncated pyramid shape, having a height "$h_1$" and a flat surface 118 at its apex. In other embodiments of the invention, the contact tip may be pyramidal without a truncated apex, or may be prism-shaped, with or without a truncated tip; or any other suitable shape such as a hemisphere. Pyramids and prisms are commonly used because they are tapered shapes capable of providing a well-supported raised tip, and are readily formed by etching silicon anisotropically along its crystal planes to provide pyramidal or prism-shaped pits, and then using the silicon pits as an electroplating mold. However, the invention is not limited to particular shapes of contact tips.

Similarly, alignment mark 116 may also be prism or pyramidal shaped, because it is advantageous to form the mark 116 on the same sacrificial substrate as the contact tip 114 using the same silicon etching and plating technique. To avoid inadvertent contact with a mating component, mark 116 preferably has a height "$h_2$" that is substantially less than "$h_1$," such as, for example, between about one-fourth to three-quarters of "$h_1$." The degree of difference between "$h_1$" and "$h_2$" may vary depending on the requirements of the application and the geometry of the spring contact. For example, an alignment mark that is placed "inboard" of the contact tip, that is, closer to the fixed end of beam 102, as shown in FIG. 3C, must be relatively short to prevent inadvertent contact with the mating component and build-up of debris on the alignment mark. In comparison, an alignment mark "outboard" of the contact tip, that is, towards the free end of the beam relative to the contact tip, as shown in FIGS. 2A and 2B, may be somewhat longer relative to the contact tip. Of course, whatever the relative lengths of the contact tip and alignment mark, it is generally preferable that the alignment mark be positioned so as to not contact the mating component, and this will usually mean that the alignment mark be made substantially shorter than the contact tip.

Consequently, as shown in FIG. 2B, the width "w" of the alignment mark will generally be less than the width of the contact tip, especially when pyramidal or prism-shaped features are used. At the same time, the width of the mark must be at least great enough to be visible on the vision system that will be used to align the contactor that the mark is on. Accordingly, it may be advantageous to increase at least one dimension of the alignment mark, for example, its length, to provide a more readily resolvable feature, while maintaining the height of the mark less than the corresponding contact tips.

The prism-shaped alignment mark 116 shown in plan view in FIG. 3A exemplifies such an approach. Mark 116 may be compared with pyramidal alignment mark 120 shown in plan view in FIG. 3B. Marks 120 and 116 have the same width "w" and the same height "$h_1$," but mark 120 is square in plan view while mark 116 is elongated rectangular in plan view and extends for substantially the width of pad 120. In a vision system having a minimum resolvable feature size about equal to the plan area of mark 120, the mark will appear as a single pixel or small cluster of pixels. As such, it may be difficult to distinguish from the surrounding environment that may contain irregularities, such as accumulated debris or oxidation. Such irregularities may appear as single pixels or irregular clusters of pixels, creating a mottled background from which it may be difficult to discern the alignment mark. By comparison, mark 116 will appear as a line of pixels that is much more likely to stand in visual contrast to the surrounding environment. As shown in FIG. 3C, in an embodiment of the invention, alignment mark 116 has a length 'l1' that is less than the width length 'l2' of pad 112 so that an open region exists at each end of alignment mark 116. A point of the line, such as an endpoint or midpoint, may be selected for use as a reference point.

In other embodiments of the invention, a slab-shaped alignment feature, such as a pad, is provided on a contact structure, optionally separate from the pad of the contact tip. An exemplary circular slab-shaped alignment pad 126 is shown in FIGS. 4A–4B. Pad 126 is essentially a form of alignment mark produced at a different step of a process for forming microelectronic contacts. FIG. 4A shows a side view of the mark 126 and an adjacent tip structure 110 on a tip portion of a spring contact beam 102. FIG. 4B shows the same structure in plan view. Such slab-shaped pads shaped and positioned for alignment purposes may be particularly useful for certain applications, for example, when there is very limited available height for an alignment mark, when the contact tip 114 is formed by some process other than an etch/plating process, or when a relatively large alignment structure is desired. Alignment pad 126 is preferably formed and attached to beam 102 in the same process steps with contact tip pad 112, thereby achieving accurate registration with respect to contact tip 114. Alignment pad 126 is preferably separate and spaced apart from pad 112, to avoid contamination with debris from tip 114 and for greater visibility. Alignment pad 126 also preferably has a distinct shape for greater visibility. A circular shape is particularly preferred because the center of the circle is readily determined for use as a reference point, while the relatively large circle is readily visible. However, any other suitable shape may be used.

FIGS. 5A–5E illustrate application of the foregoing structures to an exemplary contactor. Contactor 130 comprises a generally slab-shaped substrate 132, typically a ceramic material. As used herein, "contactor" includes specialized devices for making electrical contact with semiconductor devices in wafer form during the electrical testing of semiconductor devices. In addition, "contactor" may include any other device having a plurality of contact elements, for example, but not limited to, microelectronic spring contacts, for making contact with any type of mating component, wherein the contacts on the contactor are aligned with the mating component using a vision system.

Figure 5A:
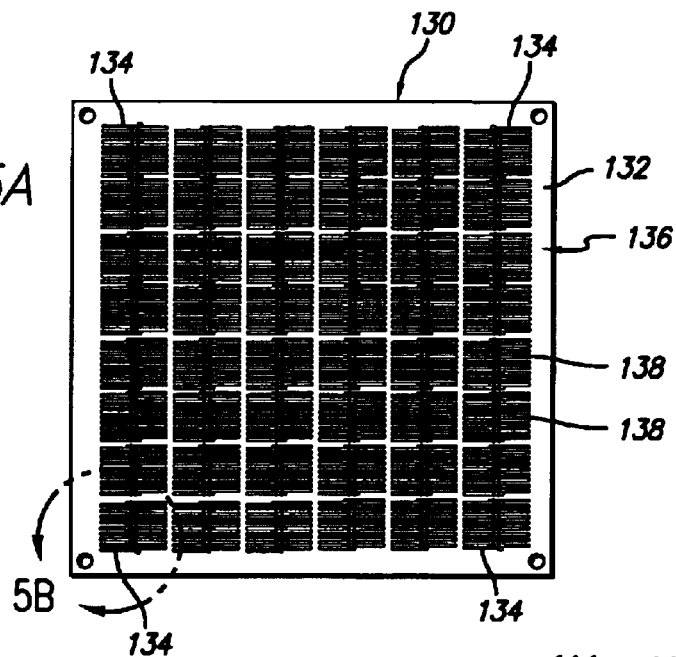
FIG. 5A is a plan view of an exemplary contactor having a plurality of microelectronic spring contacts, selected ones of which have tip structures with alignment marks according to the invention.

As shown in FIG. 5A, a typical contactor may comprise a plurality of spring contacts 136, that may in turn be arrayed in a plurality of groups 138. In an embodiment of the invention, most of the plurality of spring contacts 136 will not have an alignment mark. A selected few of the spring contacts, for example, the four spring contacts 134, are provided with an alignment mark. The marked contacts 134 are located so that the position of all of the contacts 136 may be accurately determined from the position of the marked contacts. For many applications, at least three or four alignment marks are needed to align the contactor. However, additional marked contacts 134 may be provided for purposes of redundancy; for example, a marked contact may be provided in each group 138 (not shown). It should be appreciated that contactor 130 and contacts 136 are not drawn to scale. Furthermore, for illustrative clarity, contacts 136 are drawn somewhat larger relative to contactor 130 than may be typical for semiconductor wafer applications. Details of contactor 130, contacts 136, and methods of making these components, may be as known in the art or as otherwise disclosed in the incorporated references.

Figure 5B:
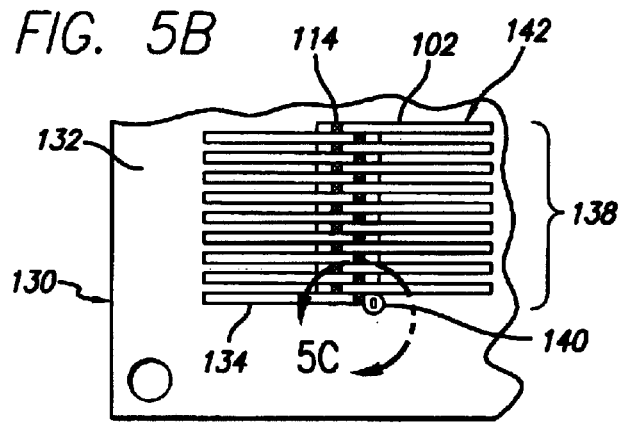
FIGS. 5C–5D are plan views, at successively higher levels of magnification, of the spring contacts and tip structures with alignment marks on the exemplary contactor shown in FIG. 5A.
FIG. 5E is a plan view of a tip structure similar to that shown in FIG. 5D, having an alternative shape of alignment mark.

FIG. 5B shows an enlarged view of a group of spring contacts 138 on contactor 130. A typical interleaved arrangement of the spring contacts 136 is apparent, as are individual beams 102 and contact tips 114 of each spring contact 142. The post or column elements are hidden behind the beam 102 of each spring contact. Also apparent is a distinctive-shaped pad 140. A relatively large pad, such as pad 140, may additionally provide space for a larger alignment mark; or may itself serve as an alignment mark. The distinctive shape of pad 140 facilitates locating the marked contactor 134. The pad 140 may be located using a vision system at low magnification, because of its relatively large size and distinctive shape. Then, magnification of the vision system may be increased to locate the alignment mark on the contactor 134.

Figure 5E:
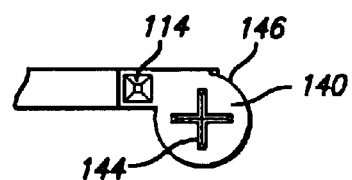
Figure 5D:
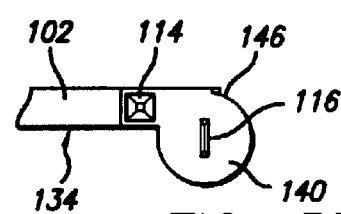
Figure 5C:
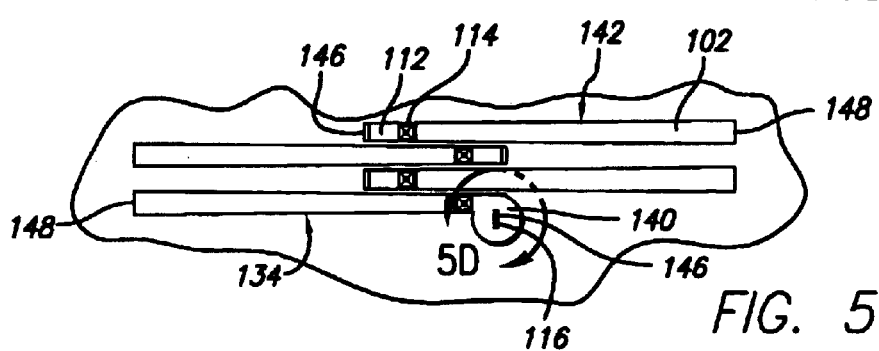

FIG. 5C shows the marked contact 134 and adjacent unmarked contacts 142. The components of unmarked contacts 142 and marked contact 134 are more readily apparent in this enlarged view. Pad 112, contact tip 114, and beam 102 of each contact 142 are apparent. Tip 114, pad 140, beam 102, and alignment mark 116 of contact 134 are also apparent. The free end 146 and fixed end 148 of the contacts 142, 134 are also indicated respectively. In an embodiment of the invention, unmarked contacts 142 and marked contacts 134 are provided with the same type of beams 102 and contact tips 114. However, in alternative embodiments, the marked contact 134 may use a beam configuration and/or contact tip configuration that is different from unmarked contacts 142. For example, in an embodiment of the invention, structure 134 serves only as a support for an alignment mark, and has no contact tip.

FIG. 5D shows an enlarged view of pad 140 at the free end 146 of beam 102. A prism-shape alignment mark 116 is provided on pad 140, as previously described with respect to FIGS. 2A–2B. Alternatively, the circular portion of pad 140 may be used as the aligning feature, and mark 116 may be omitted. Or, more than one alignment mark may be provided on the same pad 140, for example, two parallel alignment marks like mark 116 may be provided. A cross-shaped mark 144, as shown in FIG. 5E, comprised of two crossed prisms, may be particularly helpful for indicating a reference point at the intersection of the cross. Each of the foregoing marks may be made using a lithographic mask/etch process as described below.

Figure 6:
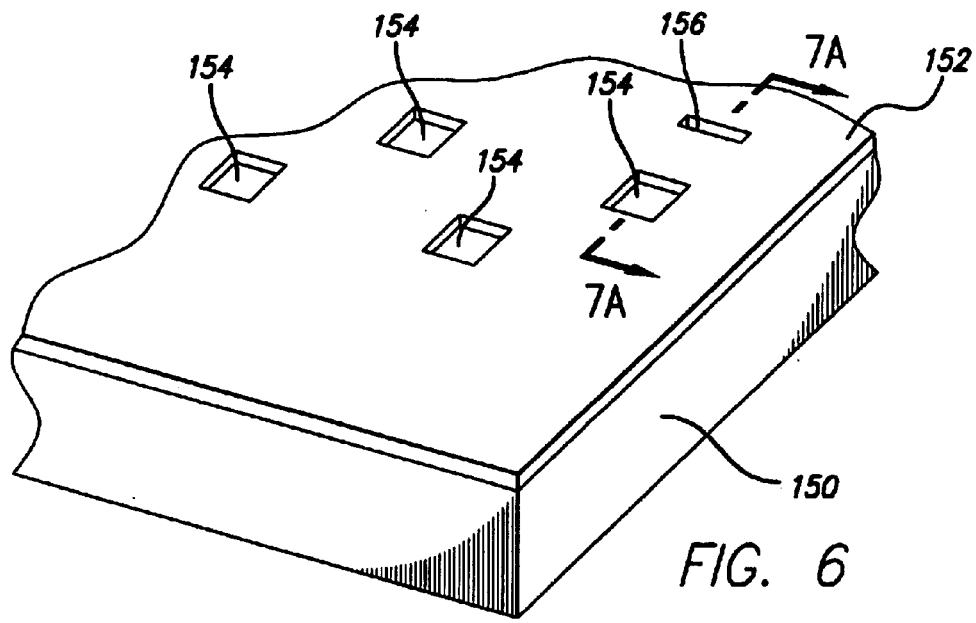
FIG. 6 is a perspective view of a sacrificial substrate at an exemplary step of a process for making a plurality of tip structures like those shown in FIGS. 5A–5D.

FIG. 6 shows a perspective view of a sacrificial substrate 150 covered by a resist layer 152 during an exemplary step of a method for making an alignment mark according to the invention. Substrate 150 is typically a silicon substrate and has a planar face extending for a region preferably at least as large as the face of the contactor to be provided with spring contacts. Other substrate materials may be used if sufficiently uniform and capable of providing a planar surface that may be uniformly and predictably etched under a patterned resist layer. Resist layer 152 may be any suitable photo-resist material, as known in the art. Layer 152 is patterned to provide square openings 154 (four of many shown) in the positions where contact tips are desired and rectangular openings 156 (one of many shown) where alignment marks are desired. As should be apparent, a square hole will yield a pyramidal pit when the underlying substrate is etched, and a rectangular hole will yield a prism-shaped pit. Other shapes, e.g., crosses, cones, truncated cones, etc., may be provided by a suitable combination of substrate and opening shape.

Figure 7A:
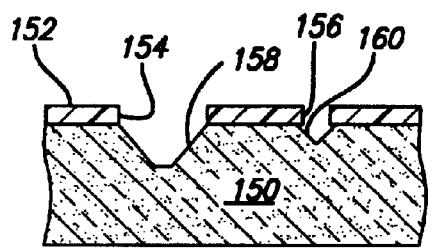
FIG. 7A is a cross-sectional view of a portion of the sacrificial substrate shown in FIG. 6, showing etched features for forming a co-located contact tip and alignment mark in an exemplary step of a process for forming a spring contact with an alignment mark according to the invention.

FIG. 7A shows a cross-section through exemplary ones of the square openings 154 and rectangular openings 156 after etching of substrate 152. In an embodiment of the invention, the etching is halted at a point before the pyramidal pit is fully etched. At this point, prism-shaped pit 160, although over-etched, is shallower than pit 158. That is, the depth of pit 158 is controlled primarily by the time of exposure to the etch solution while the depth of pit 160 is controlled primarily by the relative size of opening 156. After pit 160 is etched to the edge of opening 156, further etching ("over-etching"), should proceed more slowly than etching of adjacent pit 158. Production of adjacent pits of different and controllable depth is thereby achieved.

Figure 7B:
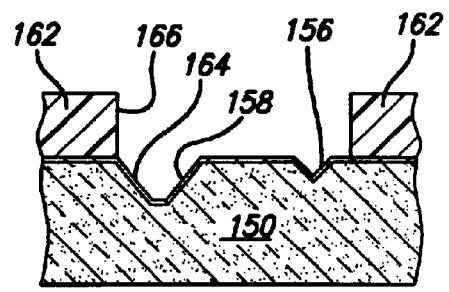
FIGS. 7B–7D are cross-sectional views of a sacrificial substrate and materials layered thereon during exemplary steps of a process for forming a spring contact with an alignment mark according to the invention.

FIG. 7B shows the same portion of substrate after further processing, as follows. After the desired pit depths are achieved, etching is halted and resist layer 152 is removed as known in the art. Typically, a conductive seed and/or release layer 164 is applied over the surface of the substrate to facilitate subsequent electroplating and release of the tip structure from substrate 150. Suitable materials for seed and/or release layer 164 are known in the art, or are described in the incorporated references. A second resist layer is applied as known in the art and patterned to reveal a pad-shaped opening 166 for electroplating a tip structure and support pad for an alignment mark. FIG. 7B shows a single opening disposed over both pits 158 and 156. However, two separate openings (one disposed over each pit 156, 158) may be provided for forming separate pads, if desired. Furthermore, for embodiments where no raised alignment mark is to be formed, e.g., where the alignment mark is pad-shaped, pit 156 may be omitted.

Figure 7C:
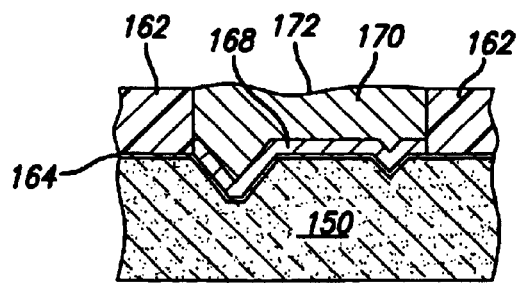
Figure 7D:
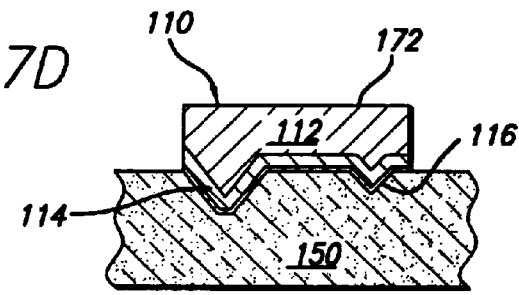

The pad shaped opening 166 is then filled with one or more metallic layers 168, 170, such as by electroplating, to provide a filled opening as shown in FIG. 7C. The composition of layers 168, 170 is as known in the art. Any number or composition of layers may be used, and the invention is not limited thereby. The exposed surface 172 of the topmost layer 170 may then be planarized, such as by chemical-mechanical polishing, and the second resist layer 162 is removed to reveal a tip structure 110, comprised of a pad 112, a contact tip 114, and an alignment mark 116, as shown in FIG. 7D and as previously described. It should be apparent that a plurality of similar tip structures, for example, some with alignment marks like mark 116, others with only one of a contact tip or alignment mark, and perhaps others with no contact tip or alignment mark at all, will be present on substrate 150, having their exposed surfaces in substantially the same plane. Such tip structures are then ready for joining to an array of spring contacts like, for example, those shown in FIGS. 5A–5C. It should be appreciated that tip structures 110 may take a variety of shapes and are not limited to the pyramidal shape discussed in the preceding paragraphs.

Figure 7E:
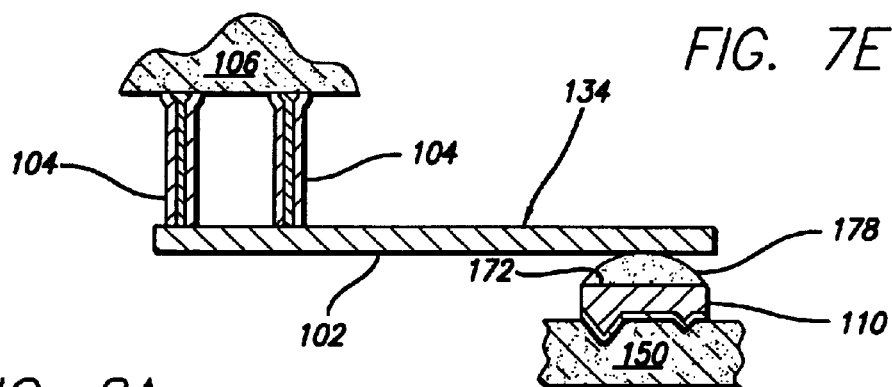
FIG. 7E is a cross-sectional view showing a spring contact and tip structure with an alignment mark during an exemplary attachment step.

FIG. 7E shows a cross-section of an exemplary contact structure 134 during a step for joining beam 102 to tip structure 110. A joining material 178, such as a solder paste, is accurately dispensed on surface 172, as known in the art. Substrate 150 is placed in a suitable holding fixture and substrate 106, with a plurality of contact structures in place on its surface, is lowered in parallel relationship to substrate 150 and aligned so that each contact structure, e.g., contact structure 134, is aligned with a corresponding tip structure, e.g., structure 110. The substrates are moved together until the joining material contacts both tip structure 110 and beam 102. The joining material is then activated, e.g., by heating, which then pulls the tip structure and beam together by surface tension to a relatively uniform position in which the material is hardened (such as by cooling). Careful control over the surface properties of the material to be joined, the amount of joining material applied per unit area, the alignment of substrates 106 and 150, and curing conditions (such as temperature), will generally yield a uniform thickness of bond over the large plurality of tip structures across a contactor substrate. The bond thickness affects the accuracy with which the z-position (direction perpendicular to substrate 106) of the contact tips and alignment marks are known. The x- and y-positions (positions in a plane parallel to substrate 106) are fixed by the sacrificial substrate and pattern masking steps. Hence, the position of adjacent tip structures and alignment marks can be determined with the required accuracy in three dimensions across the substrate. The positional accuracy can be confirmed by comparing measured versus expected positions of selected contact tips across a substrate, relative to the principal alignment marks. If variances exceed the specified tolerance (e.g., ½ the semiconductor device terminal pitch), the substrate should be repaired or discarded.

Figure 8A:
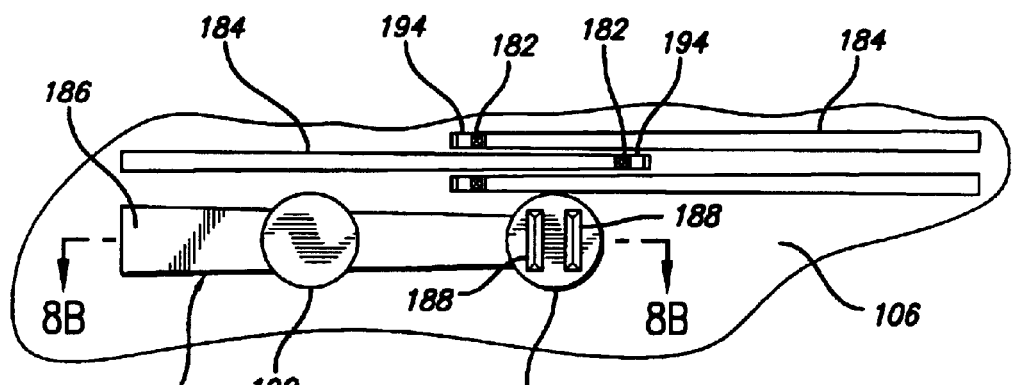
FIG. 8A is a plan view showing an alternative structure with an alignment mark according to the invention and adjacent spring contacts having relatively small "microtip" contact tips on a contactor substrate.

Alignment marks need not be placed on contact structures exactly like the structures which carry contact tips. The alignment function of the marks may also be realized by placing them on elevated platforms that are constructed to provide a mounting surface substantially co-planar with the surfaces to which the contact tips are mounted. The elevated platform may be resilient, or supported to be substantially rigid (i.e., substantially non-resilient). A plan view of a substantially rigid elevated platform 180 adjacent to spring contacts 184 on a substrate 106 is shown in FIG. 8A. The configuration shown in FIG. 8A may be desirable in applications which use contact "microtips" 182 on tip structures 194, and correspondingly small contact structures 184. Structures 184 may be too small to support alignment marks 188, 192. Therefore, an elevated platform 180 with a relatively large beam 186 may be provided for mounting the alignment marks. Alignment marks 188, 192 may thus be formed on the same sacrificial substrate as microtips 182, and transferred together with the microtips to structures 180, 184 on substrate 106. Registration between the alignment marks and the microtips is achieved in the same way as previously described.

Figure 8B:
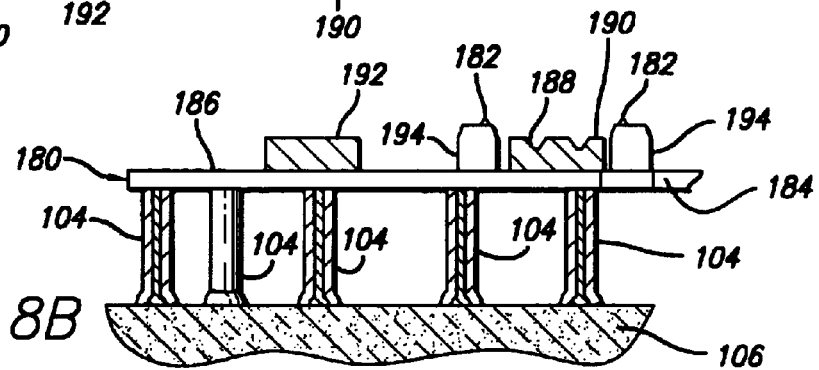
FIG. 8B is a cross-sectional view of the substrate and alternative structure shown in FIG. 8A.

A side cross-section of platform 180 is shown in FIG. 8B, with portions of contact structures 184, and especially, tip structures 194, visible behind the platform. Pad-type alignment mark 192 has a smooth surface without raised or recessed structures. Recessed alignment marks 188 are provided in an upper surface of pad 190. Beam 186 is supported along its length by four columns 104, and is accordingly substantially rigid relative to cantilevered beams of spring contacts 184.

When the alignment marks are large relative to the contact tips, if may be preferable to use pad-type marks like mark 192 or recessed marks like marks 188. Raised alignment marks may be less preferred for such applications, because of the small clearance provided by the contact tips. Furthermore, contact tips like microtips 182 may not provide sufficient vertical clearance even when the alignment marks are not raised, e.g., pad-type mark 192 and/or marks 188 below the surface of pad 190. Therefore, it may be further desirable to recess the pad-type mark and pads for alignment marks below the base of the microtips, as shown in FIG. 8B. At the same time, however, the alignment marks and/or their pads are preferably formed on the same sacrificial substrate as the microtips, for the purpose of maintaining accurate registration between the marks and the tips. To achieve the desired structure on the same sacrificial substrate, a different sequence of manufacturing steps than previously described is used.

Figure 9A:
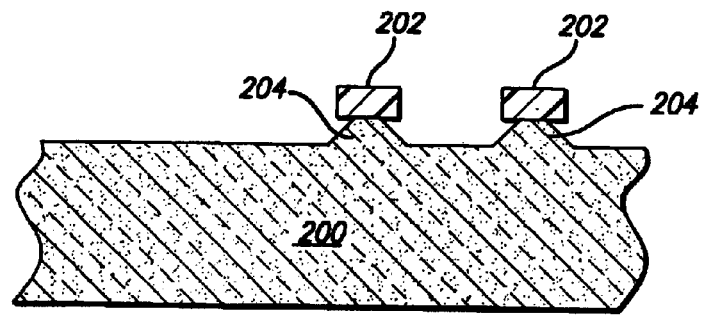
FIGS. 9A–9D are cross-sectional views of a sacrificial substrate and materials layered thereon during exemplary steps of a process for forming recessed alignment marks and adjacent contact tips such as shown in FIG. 8B.
Figure 9B:
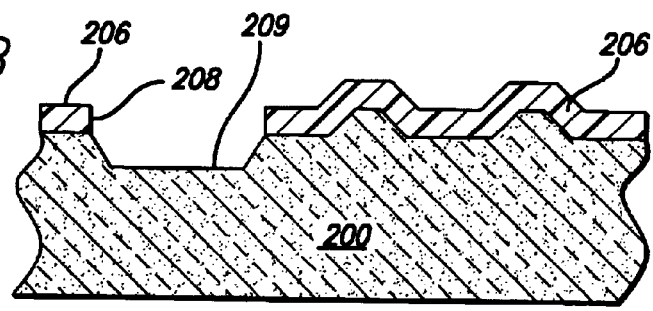
Figure 9C:
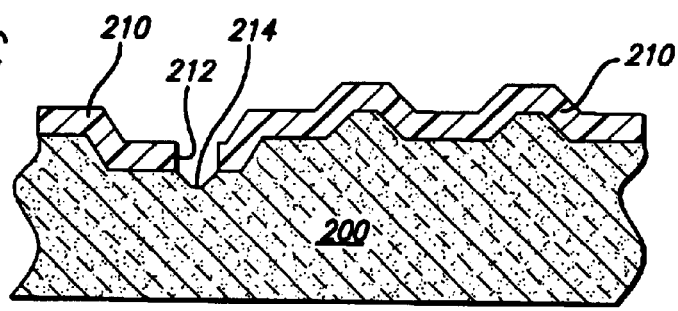
Figure 9D:
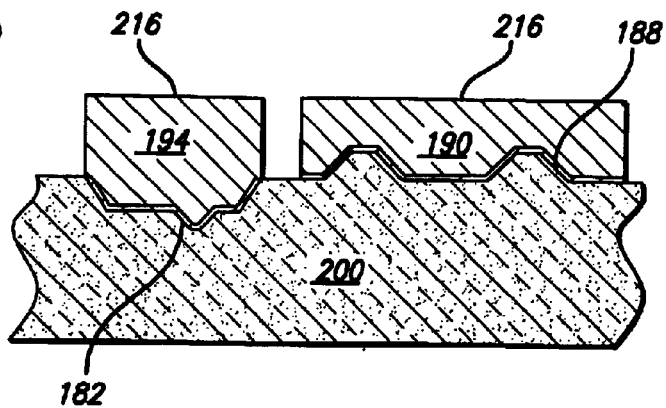

FIGS. 9A–9F show cross-sectional views of a substrate and materials layered thereon during steps of an exemplary sequence for making relatively large alignment marks adjacent to microtips. The sacrificial substrate 200 may be silicon or other etchable material as previously described. A first resist layer 202 is deposited and patterned to reveal most of the substrate 200 except for directly over where any recessed alignment marks are to be formed. The substrate 200 is then etched to provide protrusions under the remaining areas of resist 202. The shape of the protrusions will depend on the etching properties of the substrate 200, the etching method employed, and the shape of the resist areas 202. For example, under-etching a rectangular resist area on a crystalline silicon substrate will provide a truncated prism-shaped protrusion. An exemplary cross-section of two such protrusions 204 is shown in FIG. 9A.

The first resist layer 206 is then stripped and a second resist layer 206 is applied and patterned to reveal pad-shaped openings like opening 208 where tip structures are to be formed. The substrate is again etched to provide a plurality of pad-shaped recesses like recess 209 shown in FIG. 9B.

The second resist layer is then stripped, and a third resist layer 210 is applied and patterned to provide a plurality of small openings like opening 212 where contact tips are to be formed. The substrate 200 is again etched to form a plurality of pyramidal pits like pit 214 shown in FIG. 9C.

The third resist layer is then stripped and a seed/release layer (not shown) is applied. A fourth resist layer (not shown) is applied to substrate 200 and patterned to provide pad-shaped openings over protrusions 204 and pits 214, similarly to as previously described in connection with FIG. 7B. The substrate is then plated with one or more layers of metal to substantially fill the openings, and the exposed plated areas are planarized, similarly to as previously described in connection with FIG. 7C. The fourth resist layer is removed to reveal a plurality of tip structures 194 and recessed alignment marks 188 in pads 190, like those shown in FIG. 9D. The tip structures and pads have planarized mounting surfaces 216 suitable for joining to a plurality of contact structures, similarly to as previously described in connection with FIG. 7E. Structures like those shown in FIGS. 8A–8B may thereby be produced.

It should also be appreciated that the alignment mark may be added to the tip structure after producing the tip structure, for example, by further selective etching or laser marking. Although it is generally preferable to form the alignment marks in the same lithographic step as the contact tips, this may not always be possible. For example, it some cases it may be desirable to add alignment marks to a contactor that was manufactured without them. The following example exemplifies a method for adding alignment marks in a later step.

Figure 10A:
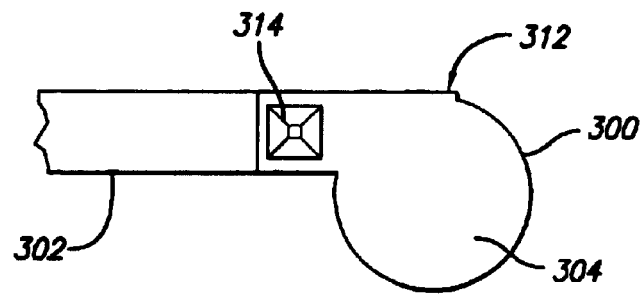
FIGS. 10A–10C are plan views of an exemplary tip structure during steps of a process for forming an alignment mark using a tool for marking the tip structure after attachment of the contact tip.
Figure 10B:
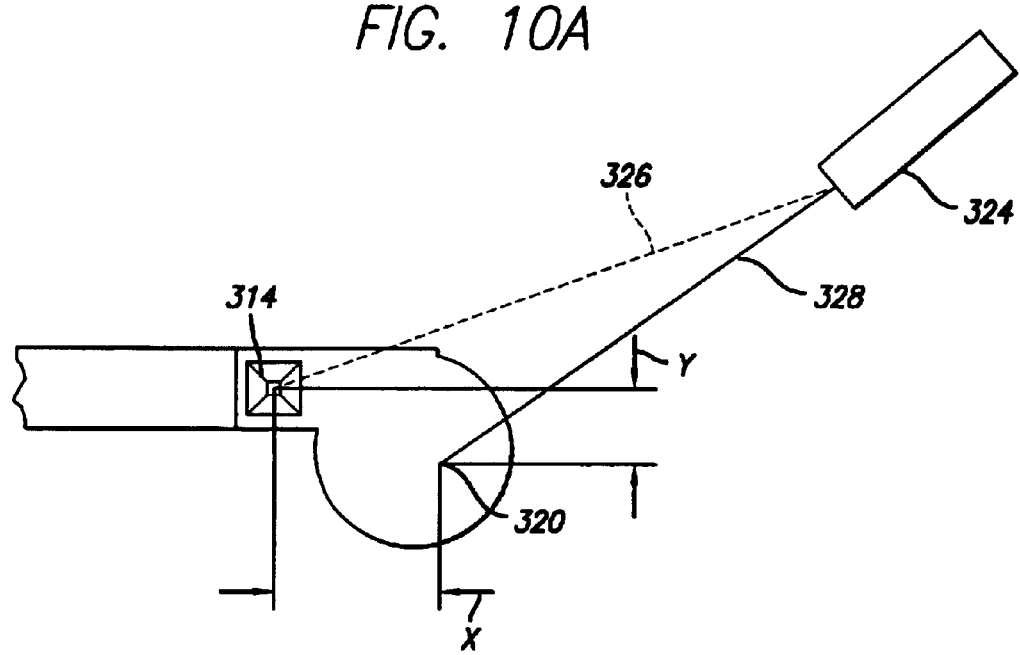
Figure 10C:
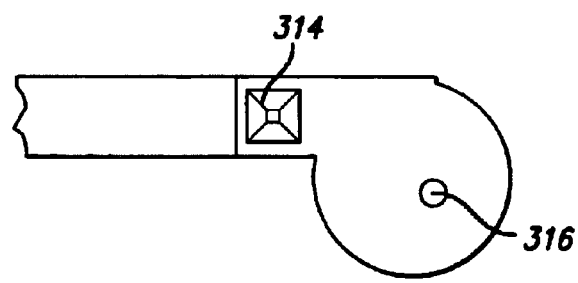

Referring to FIG. 10A, the pad 300 of tip structure 312 includes a contact tip 314, which may be produced, for example, by one of the processes described above. Tip structure 312 may optionally be mounted to a beam 302 of a spring structure. Marking area 304 is provided in which the alignment mark is to be placed. In FIG. 10B, a laser marking system 324 can be aligned by targeting a low power beam 326 on the contact tip 314, and then offset a defined distance to a marking location 320. The laser 324 may then be fired to emit a higher power beam 328 of sufficient power to create a precise mark 316 (shown in FIG. 10C). The marking location 316 (target of the laser beam) is offset a predetermined spatial distance, for example, an offset in x, and y and directions is shown. The offset may additionally include an offset in a z-direction (not shown). As shown in FIG. 10C, the mark 316 is defined at the center of the target of the laser beam. Alignment of a contactor using a subsequently formed mark, such as mark 316, as a reference point is possible. By way of further example, direct deposition of mark 316 can be accomplished using a gas phase organo-metallic precursor and ion beam direct write. The contact tip 314 is targeted and then the ion beam assisted metal deposition is used to create the features of mark 316 a defined offset away from the contact tip.

In some embodiments of the invention, the relative position(s) of the contact tips may be measured and recorded in a data file or database. This data may be obtained from the design process, or measured directly after fabrication by optical or other measurement methods. Such data may be particularly useful for contactors having a plurality of contacts and alignment marks, where the amount of offset between the contact tips of the contacts and the alignments marks varies somewhat from contact to contact across the contactor. Such variations may be more likely to occur when the alignment marks are not formed in the same lithographic step as the contact tips, such as, for example, when the alignment marks are formed by laser. To obtain such data, a single point, such as the tip of a contact tip on the contactor, is preferably selected as a reference point. It can sometimes be assumed that all of the contact tips are in substantially fixed relation to the reference point, but for precise positioning, it may be desirable to measure the positions of the contact tips as well. The position of each alignment mark relative to one or more adjacent contact tips (i.e., the offset) may then be measured. From the measured offsets the coordinates of the alignment mark with respect to the fixed reference point may be determined, irrespective of any variations in offset distances. The coordinate data may then be input into the test system used to align and place the contact tips for the testing operation, and thus an optimal alignment between the contactor and the device or wafer to be tested can be obtained.

A method for aligning and contacting corresponding arrays of microelectronic contact elements using alignment marks is exemplified as follows. The arrays comprise a first array and a second array, and the object is to achieve contact between corresponding contact elements of the first array and of the second array. The contact elements of the first array comprise a plurality of contact tips in a substantially fixed relationship to the first array, and a plurality of alignment features. Selected ones of the contact elements of the first array each further comprises an alignment feature spaced apart from a contact tip, as described above. The first array may comprise contact elements of a probe card, and the second array may comprise contact elements of a wafer, but the invention is not limited thereby.

The method comprises, as an initial step, determining coordinates of the plurality of alignment features relative to selected ones of the plurality of contact tips of the first array. This can be accomplished by direct measurement, or based on a known relationship between elements formed using a pattern-masking/etch process. The second array is maintained in a known position, such as by being held in a wafer chuck mounted to the frame of a testing system. The first array is also mounted in a corresponding movable test head of the testing system. When the arrays are mounted in a suitable testing system, a position of the first array relative to the second array is determined by transforming measured positions of the plurality of alignment features relative to the second array using the coordinates. That is, the position of the contact tips of the first array is determined by measuring the position of the alignment features and applying a suitable correction based on the coordinate data. The first array is then positioned relative to the second array based on its determined position until contact is achieved between corresponding contact elements of the first array and of the second array. The position of the contact tips may be repeatedly determined as often as desired during the positioning process. Using the method, the contact tips can be positioned with accuracy to contact corresponding pads or other contact elements of the second array, without any need to find or measure the location of the contact tips themselves during the testing process.

Having thus described a preferred embodiment of fiducial alignment marks on microelectronic contacts, it should be apparent to those skilled in the art that certain advantages of the within system have been achieved. It should also be appreciated that various modifications, adaptations, and alternative embodiments thereof may be made within the scope and spirit of the present invention. For example, a fiducial alignment mark on or adjacent to a pad with a contact tip has been illustrated, but it should be apparent that the inventive concepts described above would be equally applicable to any fiducial mark that is attached to (or formed on) an array of contacts in the same manufacturing step as the contact tips of the array. Furthermore, the inventive concepts would also be applicable to alignment marks that are placed on other types of microelectronic contacts than shown herein, in registration with, or in measured relation to co-located contact tips. For example, alignment marks may be placed on membrane probe cards or on contact elements that are not primarily resilient, such as on buckling-type probes. Similarly, the method of aligning arrays of contact elements using alignment marks on contact elements of at least one of the arrays is not limited to use with a particular type of contactor or device. Rather, the method may be used with any array of contact elements upon which it is possible to place alignment marks or features in registration or measured relation with the contact tips or points of such contact elements. The invention is further defined by the following claims.

What is claimed is:

1. A tip structure for a contact element for contacting a semiconductor device, comprising
    a contact tip disposed on a surface of a pad and having a distal end protruding above the surface of the pad;
    an alignment mark fixed relative to the pad and spaced apart from the contact tip,
    wherein the alignment mark is disposed on the pad entirely substantially below the distal end of the contact tip.

2. The tip structure according to claim 1, wherein the alignment mark is recessed below the surface of the pad.

3. The tip structure according to claim 1, wherein the alignment mark protrudes above the surface of the pad.

4. The tip structure according to claim 1, wherein the alignment mark comprises a shape selected from a pyramid, an elongated pyramid, a cross, a circle, a square, a triangle, and parallel lines.

5. A contactor for contacting a semiconductor device, the contactor comprising:
    a plurality of contact structures disposed above the upper surface of a substrate and presenting a plurality of contact tips each for contacting a terminal of the semiconductor device;
    means for aligning each of the plurality of contact tips with a terminal of the semiconductor device,
    wherein the means for aligning comprises a plurality of alignment marks on at least selected ones of the plurality of contact structures and spaced apart from the plurality of contact tips.

6. A contactor for contacting a semiconductor device in wafer form, the contactor comprising;
    a plurality of contacts disposed on a substrate to present a plurality of contact tips having their distal tips in a plane substantially parallel to the substantially planar surface; and
    a plurality of alignment marks disposed on the contactor substantially below the plane wherein the distal tips of the contact tips are disposed.

7. The contactor according to claim 6, wherein at least selected ones of the plurality of contacts further comprises a tip structure, the tip structure comprising a pad, a contact tip attached to the pad, and at least one of the plurality of alignment marks attached to the pad.

8. The contactor according to claim 7, wherein the at least one of the plurality of alignment marks is recessed below a surface of the pad.

9. The contactor according to claim 7, wherein the at least one of the plurality of alignment marks is raised above the surface of the pad.

10. The contactor according to claim 6, wherein at least selected ones of the plurality of contacts further comprise a tip structure, the tip structure comprising a first pad, and a contact tip attached to the first pad, and a second pad in substantially the same plane as the first pad, the second pad comprising at least one of the plurality of alignment marks.

11. The contactor according to claim 6, further comprising a plurality of raised platforms disposed on the surface of the substrate, each of the plurality of raised platforms comprising at least one of the plurality of alignment marks attached thereto.

12. The contactor according to claim 11, wherein each of the plurality of raised platforms further comprises a pad attached thereto, and wherein the at least one of the plurality of alignment marks is recessed below a surface of the pad.

* * * * *